(12) United States Patent
Tazuke

(10) Patent No.: US 6,850,232 B2
(45) Date of Patent: Feb. 1, 2005

(54) SEMICONDUCTOR DEVICE CAPABLE OF INTERNALLY GENERATING BIAS CHANGING SIGNAL

(75) Inventor: Toshikazu Tazuke, Shiga (JP)

(73) Assignee: NEC Electronics Corporation, Kawasaki (JP)

(*) Notice: Subject to any disclaimer, the term of this patent is extended or adjusted under 35 U.S.C. 154(b) by 234 days.

(21) Appl. No.: 10/225,865

(22) Filed: Aug. 22, 2002

(65) Prior Publication Data

US 2003/0043129 A1 Mar. 6, 2003

(30) Foreign Application Priority Data

Aug. 28, 2001 (JP) .................................. 2001-257198

(51) Int. Cl.[7] ................................................ G09G 3/36
(52) U.S. Cl. .................... 345/204; 345/98; 345/211; 345/99; 713/322
(58) Field of Search ...................... 345/204, 87–104, 345/208–210, 55, 56, 60, 211

(56) References Cited

U.S. PATENT DOCUMENTS

| 5,218,352 A | * | 6/1993 | Endoh et al. ................. 345/87 |
| 6,005,541 A | * | 12/1999 | Takahashi et al. ............ 345/87 |
| 6,633,270 B2 | * | 10/2003 | Hashimoto .................... 345/76 |
| 2003/0016200 A1 | * | 1/2003 | Hashimoto .................... 345/94 |
| 2003/0043129 A1 | * | 3/2003 | Tazuke ....................... 345/204 |
| 2003/0234758 A1 | * | 12/2003 | Bu et al. ...................... 345/90 |

FOREIGN PATENT DOCUMENTS

JP          9-093055        4/1997

* cited by examiner

Primary Examiner—Lun-Yi Lao
(74) Attorney, Agent, or Firm—Katten Muchin Zavis Rosenman

(57) ABSTRACT

In a semiconductor device, at least one operational amplifier drives a capacitive load in accordance with a control signal. A bias changing circuit receives the control signal to generate a bias changing signal in synchronization with the control signal dependent upon a width of the control signal. A bias circuit controls a bias current flowing through the operational amplifier in accordance with the bias changing signal.

16 Claims, 15 Drawing Sheets

SEL="LOW"

| STB WIDTH (CLK) | VALUE OF COUNTER 61 | | | T (CLK) |
|---|---|---|---|---|
| | $2^5$ | $2^6$ | $2^7$ | |
| 1~31 | 0 | 0 | 0 | 32 (=$2^5$) |
| 32~63 | 1 | 0 | 0 | 64 (=$2^6$) |
| 64~95 | 0 | 1 | 0 | 96 (=$2^5+2^6$) |
| 96~127 | 1 | 1 | 0 | 128 (=$2^7$) |
| 128~159 | 0 | 0 | 1 | 160 (=$2^5+2^7$) |
| 160~191 | 1 | 0 | 1 | 192 (=$2^6+2^7$) |
| 192~223 | 0 | 1 | 1 | 224 (=$2^5+2^6+2^7$) |

SEL="HIGH"

| STB WIDTH (CLK) | VALUE OF COUNTER 61 | | | T (CLK) |
|---|---|---|---|---|
| | $2^5$ | $2^6$ | $2^7$ | |
| 1~31 | 0 | 0 | 0 | 64 (=$2^6$) |
| 32~63 | 1 | 0 | 0 | 128 (=$2^7$) |
| 64~95 | 0 | 1 | 0 | 192 (=$2^6+2^7$) |
| 96~127 | 1 | 1 | 0 | 256 (=$2^8$) |
| 128~159 | 0 | 0 | 1 | 320 (=$2^6+2^8$) |
| 160~191 | 1 | 0 | 1 | 384 (=$2^7+2^8$) |
| 192~223 | 0 | 1 | 1 | 448 (=$2^6+2^7+2^8$) |

…

SEMICONDUCTOR DEVICE CAPABLE OF INTERNALLY GENERATING BIAS CHANGING SIGNAL

BACKGROUND OF THE INVENTION

1. Field of the Invention

The present invention relates to a semiconductor device such as a data line driver of a liquid crystal display (LCD) apparatus, and more particularly, to the improvement of generation of a bias changing signal for changing a bias current flowing through an operational amplifier (voltage follower) for driving a capacitive load.

2. Description of the Related Art

In a prior art semiconductor device such as a prior art data line driver of an LCD apparatus, a plurality of voltage followers are provided to drive a plurality of capacitive loads such data lines in accordance with a control signal such as a strobe signal. Also, a bias circuit controls bias currents flowing through the voltage followers in accordance with an externally-generated bias changing signal. That is, in a high access mode state, the bias currents are increased to increase the operation speed while the power consumption is increased. On the other hand, in a low access mode, the bias currents are decreased to decrease the operation speed while the power consumption is decreased. This will be explained later in detail.

In the above-described prior art semiconductor device, however, the bias changing signal in synchronization with the control signal has to be input as an external signal to the bias circuit, which is a burden on the user. Additionally, when the number of capacitive loads is increased, or when the resistance and capacity of the LCD panel fluctuates due to the manufacturing process thereof, the bias changing signal has to be adjusted by the user, which is another burden on the user.

SUMMARY OF THE INVENTION

It is an object of the present invention to provide a semiconductor device capable of decreasing the burden on the user.

According to the present invention, in a semiconductor device, at least one operational amplifier drives a capacitive load in accordance with a control signal. A bias changing circuit receives the control signal to generate a bias changing signal in synchronization with the control signal dependent upon a width of the control signal. A bias circuit controls a bias current flowing through the operational amplifier in accordance with the bias changing signal.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art data line drivers of an LCD apparatus will be explained with reference to FIGS. 1, 2A, 2B, 3, 4 and 5.

Figure 1:
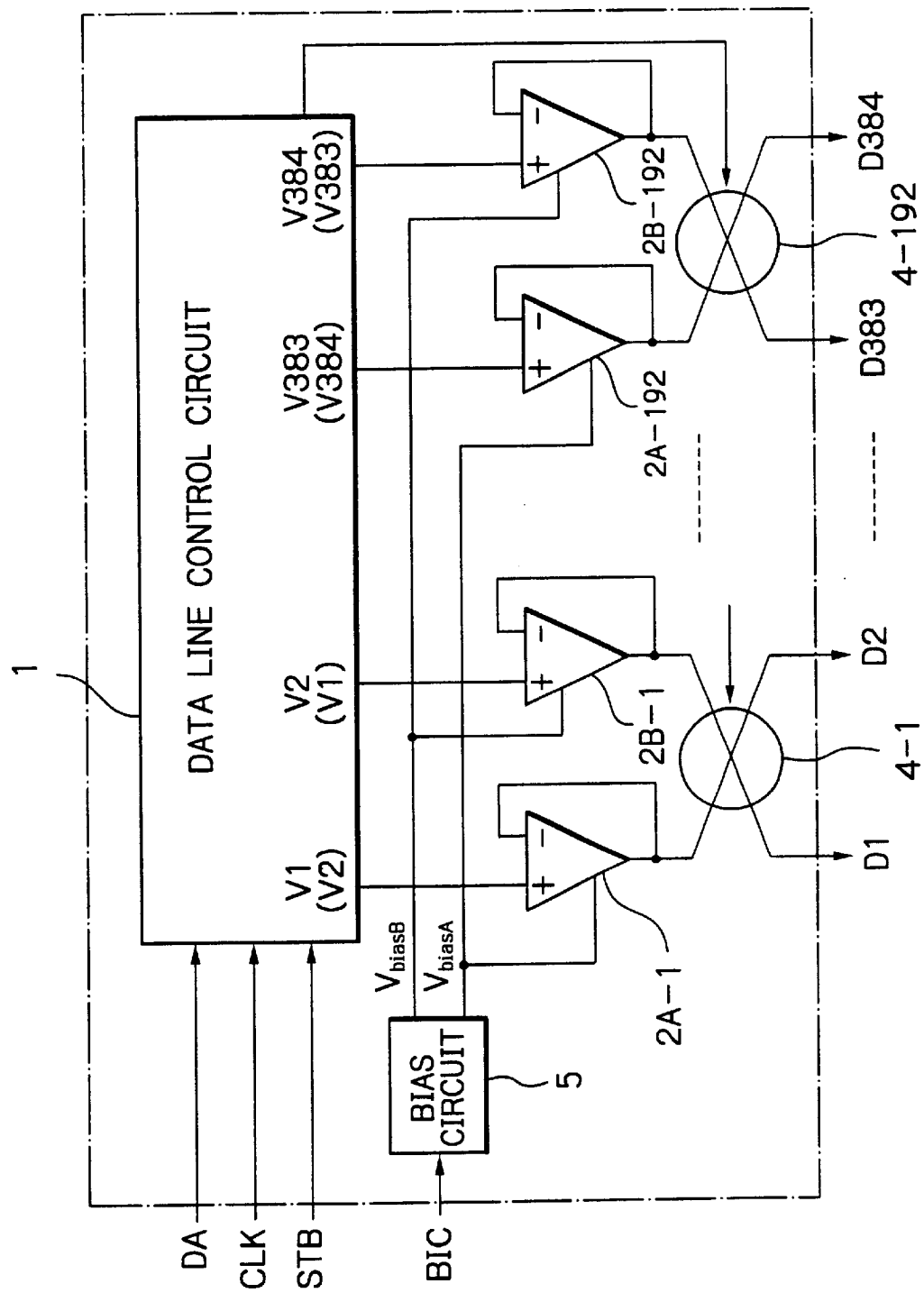
FIG. 1 is a circuit diagram illustrating a first prior art data line driver of an LCD apparatus.

In FIG. 1, which illustrates a first prior art data line driver of an LCD apparatus, reference numeral 1 designates a data line control circuit for receiving a digital video data signal DA, a clock signal CLK and a strobe signal STB, to generate multi-gradation analog data voltages V1, V2, ..., V383 and V384 (or V2, V1, ..., V384 and V383).

The data line control circuit 1 is constructed by shift registers, data registers, latch circuits, level shifters, a multi-gradation voltage generating ladder circuit and a digital/analog (D/A) converter (not shown). Note that the strobe signal STB is also used for carrying out a dot inversion driving operation.

In the data line control circuit 1, the digital video data signal DA is input in series in synchronization with the clock signal CLK. Then, a serial-to-parallel conversion is performed upon the input digital video signal. Then, each parallel video digital signal is converted into a multi-gradation analog data voltage in synchronization with the strobe signal STB.

The multi-gradation data voltages V1, V2, ..., V383, V384 (or V2, V1, ..., V384, V383) are supplied to voltage followers (operational amplifiers) 2A-1, 2A-2, ..., 2A-192 and 2B-192, respectively, for driving data lines D1, D2, ..., D383 and D384 via switches 4-1, ..., 4-192.

The voltage followers 2A-1, ..., 2A-192 are used for carrying out a positive polarity driving operation, while the voltage followers 2B-1, ..., 2B-192 are used for carrying out a negative polarity driving operation. In this case, in order to carry out a dot inversion driving operation, the voltage followers 2A-1, ..., 2A-192 alternate with the voltage followers 2B-1, ..., 2B-192.

The switches 4-1, ..., 4-192 are controlled by the data line control circuit 1. That is, when the data line control circuit 1 generates multi-gradation data voltages V1, V2, ..., V383, V384, the voltage followers 2A-1 and 2B-1 are connected to the data lines D1 and D2, respectively; ...; the voltage followers 2A-192 and 2B-192 are connected to the data lines D383 and D384, respectively. On the other hand, when the data line control circuit 1 generates multi-gradation data voltages V2, V1, ..., V384, V383, the voltage followers 2A-1 and 2B-1 are connected to the data lines D2 and D1, respectively; ...; the voltage followers 2A-192 and 2B-192 are connected to the data lines D384 and D383, respectively. Also, a bias circuit 5 receives a bias changing signal BIC to control bias voltages $V_{biasA}$ and $V_{biasB}$ of the voltage followers 2A-1, ..., 2A-192 and 2B-1, ..., 2B-192. That is, the bias changing signal BIC is externally generated.

Figure 2A:
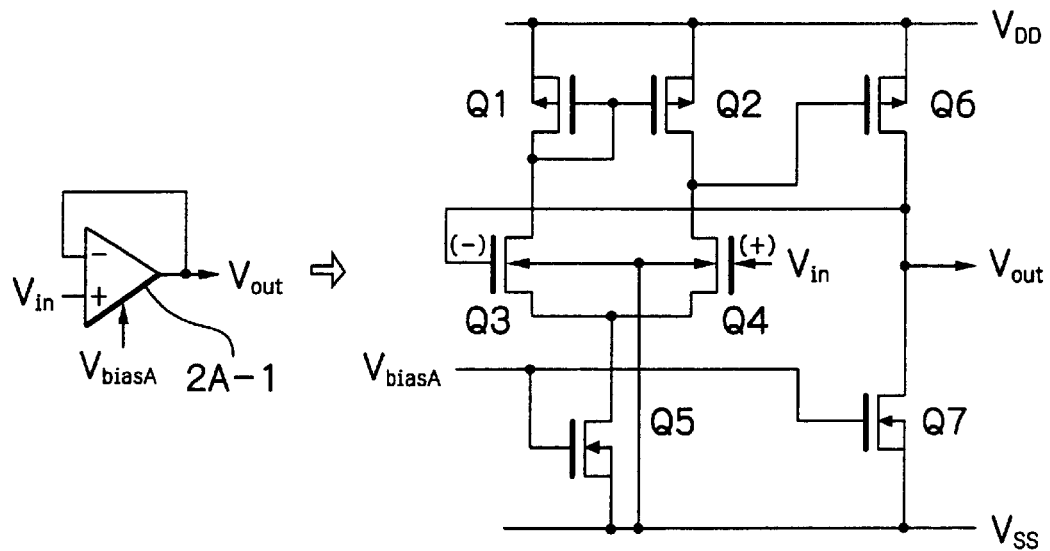
FIG. 2A is a detailed circuit diagram of the voltage follower for a positive polarity driving operation of FIG. 1.

In FIG. 2A, which is a detailed circuit diagram of the voltage follower 2A-1 (2A-192) of FIG. 1, a differential amplifier powered by a high power line $V_{DD}$ and a low power line $V_{SS}$ is formed by load P-channel MOS transistors Q1 and Q2, N-channel MOS transistors Q3 and Q4, and an N-channel MOS transistor Q5, and an output circuit powered by the high power line $V_{DD}$ and the low power line $V_{SS}$ is formed by a P-channel MOS transistor Q6 and an N-channel MOS transistor Q7. In this case, the load P-channel MOS transistors Q1 and Q2 form a current mirror circuit. Also, since the bias voltage $V_{biasA}$ is applied to the gates of the N-channel MOS transistors Q5 and Q7, each of the N-channel MOS transistors Q5 and Q7 serves as a constant current source. Therefore, in a high bias mode, i.e., a high speed mode, when the bias voltage $V_{biasA}$ is high, the output voltage $V_{out}$ rises rapidly while the power consumption is increased. On the other hand, in a low bias mode, i.e., a low speed mode, when the bias voltage $V_{biasA}$ is low, the output voltage $V_{out}$ rises slowly while the power consumption is decreased.

Figure 2B:
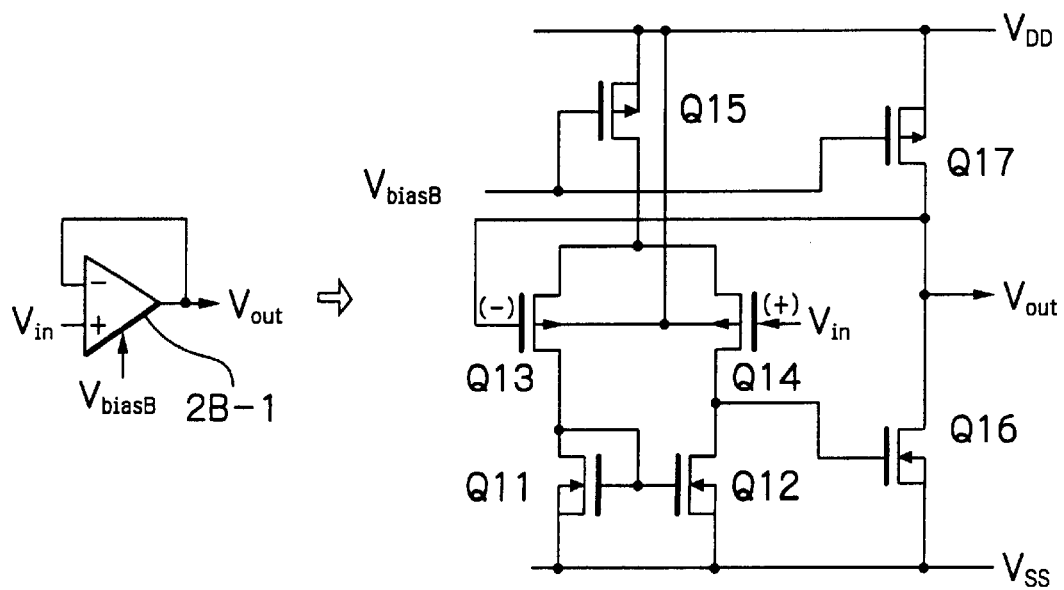
FIG. 2B is a detailed circuit diagram of the voltage follower for a negative polarity driving operation of FIG. 1.

In FIG. 2B, which is a detailed circuit diagram of the voltage follower 2B-1 (2B-192) of FIG. 1, a differential amplifier powered by the high power line $V_{DD}$ and the low power line $V_{SS}$ is formed by load N-channel MOS transistors Q11 and Q12, P-channel MOS transistors Q13 and Q14, and a P-channel MOS transistor Q15, and an output circuit powered by the high power line $V_{DD}$ and the low power line $V_{SS}$ is formed by an N-channel MOS transistor Q16 and a P-channel MOS transistor Q17. In this case, the load N-channel MOS transistors Q11 and Q12 form a current mirror circuit. Also, since the bias voltage $V_{biasB}$ is applied to the gates of the P-channel MOS transistors Q15 and Q17, each of the P-channel MOS transistors Q15 and Q17 serves as a constant current source. Therefore, in a high bias mode, i.e., a high speed mode, when the bias voltage $V_{biasB}$ is low, the output voltage $V_{out}$ falls rapidly while the power consumption is increased. On the other hand, in a low bias mode, i.e., a low speed mode, when the bias voltage $V_{biasB}$ is high, the output voltage $V_{out}$ falls slowly while the power consumption is decreased.

Figure 3:
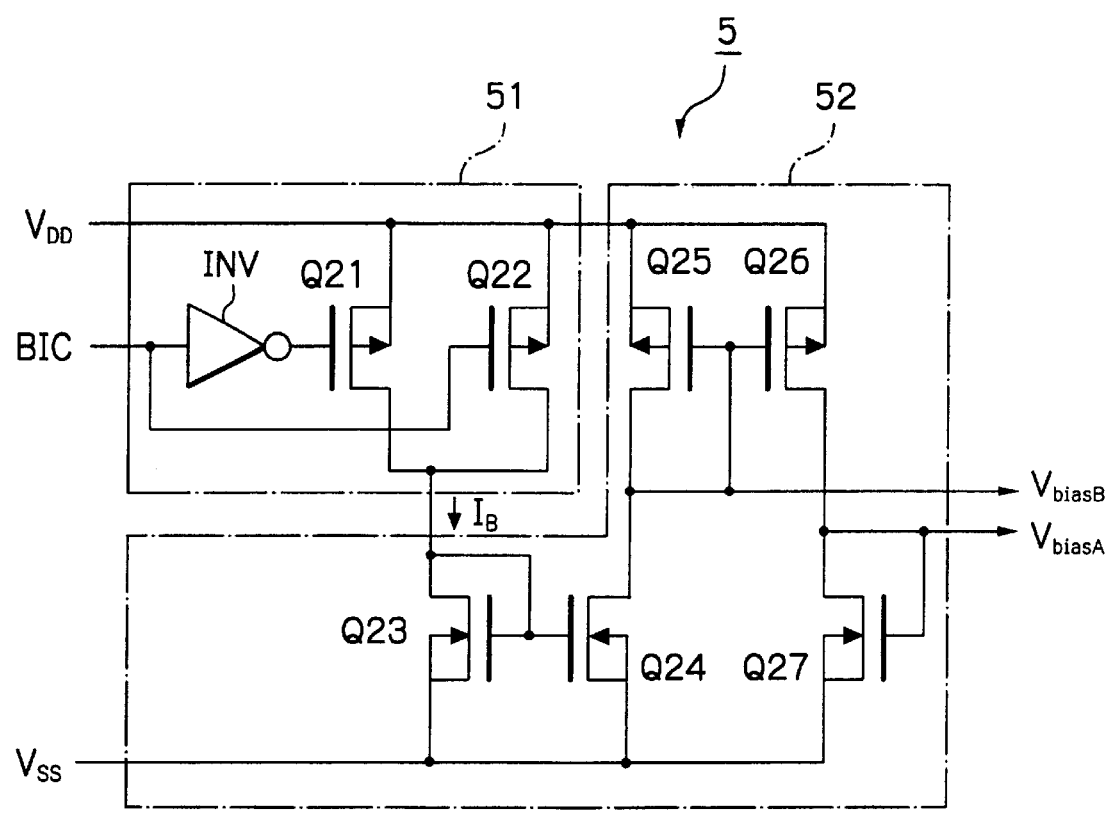
FIG. 3 is a detailed circuit diagram of the bias circuit of FIG. 1.

In FIG. 3, which is a detailed circuit diagram of the bias circuit 5 of FIG. 1, the bias circuit 5 is constructed by a bias current circuit 51 for generating a bias current $I_B$ and a bias voltage generating circuit 52 for generating the bias voltages $V_{biasA}$ and $V_{biasB}$ in accordance with the bias current $I_B$.

The bias current circuit 51 is formed by P-channel MOS transistors Q21 and Q22 having ON resistances R1 and R2 (R1<R2) connected in parallel to the high power line $V_{DD}$ and an inverter INV for selecting one of the P-channel MOS transistors Q21 and Q22 in accordance with the bias control signal BIC. The drains of the P-channel MOS transistors Q21 and Q22 are connected to the bias voltage generating circuit 52.

The bias voltage generating circuit 52 is formed by a current mirror circuit of N-channel MOS transistors Q23 and Q24 connected between the bias current circuit 51 and the low power line $V_{SS}$, a current mirror circuit of P-channel MOS transistors Q25 and Q26 connected between the high power line $V_{DD}$, and an N-channel MOS transistor Q27. In this case, a current flowing through the N-channel MOS transistor Q23, i.e., a current flowing through the N-channel MOS transistor Q24 is determined by a bias current $I_B$ of the bias current circuit 51. Also, a current flowing through the P-channel MOS transistor Q25, i.e., a current flowing through the P-channel MOS transistor Q26 is determined by the current flowing through the N-channel MOS transistor Q24. Further, a current flowing through the N-channel MOS transistor Q27 is determined by the current flowing the P-channel MOS transistor Q26.

Thus, since the current flowing through the N-channel MOS transistor Q27 depends on the bias current $I_B$, the bias voltage $V_{biasA}$ depends on the bias current $I_B$. Similarly, since the current flowing through the P-channel MOS transistor Q25 depends on the bias current $I_B$, the bias voltage $V_{biasB}$ depends on the bias current $I_B$.

In more detail, when the bias current control signal BIC is high, the P-channel MOS transistors Q21 and Q22 are turned ON and OFF, respectively, so as to increase the bias current $I_B$. As a result, the currents flowing through the transistors Q27 and Q25 are increased, and therefore, $|V_{biasA}-V_{SS}|$ and $|V_{DD}-V_{biasB}|$ are increased. On the other hand, when the bias current control signal BIC is low, the P-channel MOS transistors Q21 and Q22 are turned OFF and ON, respectively, so as to decrease the bias current $I_B$. As a result, the currents flowing through the transistors Q27 and Q25 are decreased, and therefore, $|V_{biasA}-V_{SS}|$ and $|V_{DD}-V_{biasB}|$ are decreased.

In FIG. 1, a high access mode (BIC=high) is maintained for a predetermined time period immediately after the strobe signal STB is input, and thereafter, a low access mode (BIC=low) is established, thus decreasing the power consumption. In this case, however, the bias changing signal BIC in synchronization with the strobe signal STB has to be input as an external signal to the bias circuit 5, which is a burden on the user. Additionally, when the number of data lines is increased, or when the resistance and capacity of the LCD panel fluctuates due to the manufacturing process thereof, the above-mentioned predetermined time period has to be adjusted by the user, which is another burden on the user.

Figure 4:
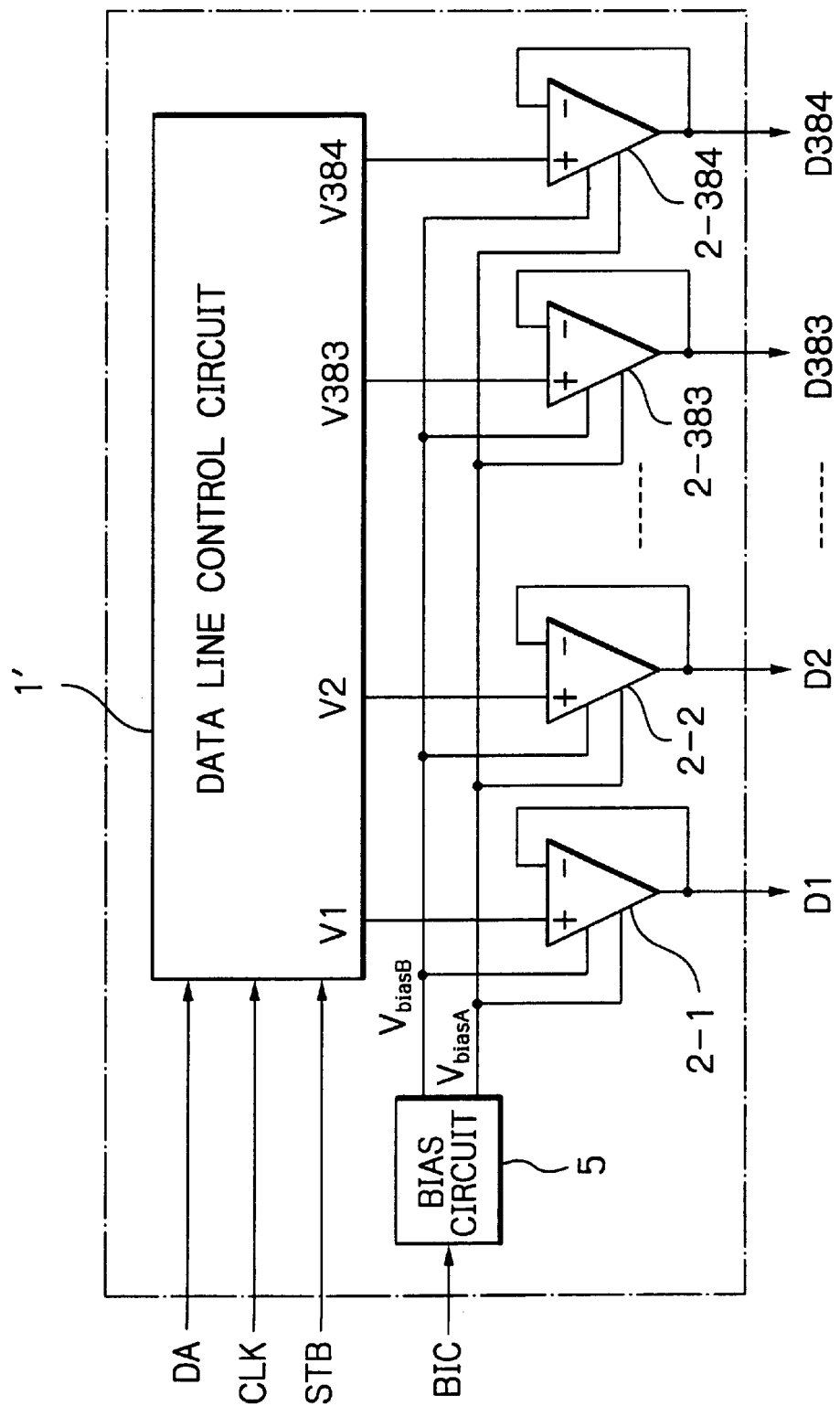
FIG. 4 is a circuit diagram illustrating a second prior art data line driver of an LCD apparatus.

In FIG. 4, which illustrates a second prior art data line driver of an LCD apparatus, a data line control circuit 1' is provided instead of the data line control circuit 1 of FIG. 1, and voltage followers 2-1, 2-2, ..., 2-383 and 2-384 are provided instead of the voltage followers 2A-1, 2B-1, ..., 2A-192 and 2B-192 and the switches 4-1, 4-2, ..., 4-383 and 4-384 of FIG. 1. In this case, the multi-gradation analog voltages V1, V2, ..., V383 and V384 are supplied to the voltage followers 2-1, 2-2, ..., 2-383 and 2-384, respectively. Note that the strobe signal STB is also used for carrying out a line inversion driving operation.

Figure 5:
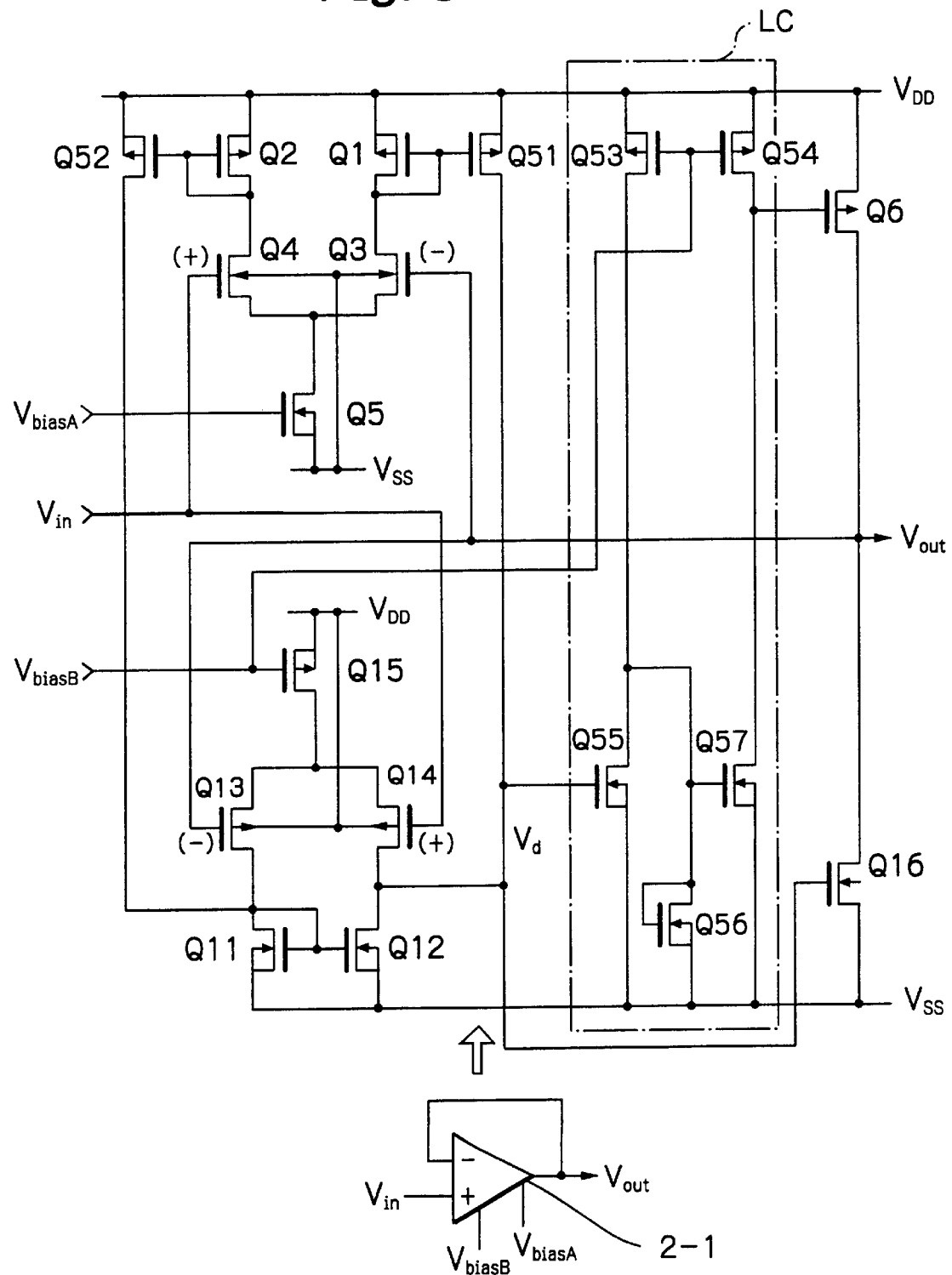
FIG. 5 is a detailed circuit diagram of the voltage follower of FIG. 4.

As illustrated in FIG. 5, each of the voltage followers 2-1, 2-2, 2-383 and 2-384 is constructed by a combination of the voltage follower 2A-1 (2A-192) of FIG. 2A and the voltage follower 2B-1 (2B-192) of FIG. 2B. In more detail, a P-channel MOS transistor Q51 forms a current mirror circuit with the P-channel MOS transistor Q1 and is connected to the load N-channel MOS transistor Q12. Also, a P-channel MOS transistor Q52 forms a current mirror circuit with the P-channel MOS transistor Q2 and is connected to the load N-channel MOS transistor Q11. Thus, the differential amplifier (Q1, Q2, . . . , Q5) is combined with the differential amplifier (Q11, Q12, . . . , Q15) by the P-channel MOS transistors Q51 and Q52.

The output voltage $V_d$ of the combined differential amplifiers is supplied via a level conversion circuit LC to the output P-channel MOS transistor Q6. On the other hand, the output voltage of the combined differential amplifiers is supplied directly to the output N-channel MOS transistor Q16.

The level conversion circuit LC is constructed by load P-channel MOS transistors Q53 and Q54, N-channel MOS transistors Q55, Q56 and Q57. In this case, the N-channel MOS transistor Q56 serves as a load.

Thus, when the input voltage $V_{in}$ rises, the voltage $V_d$ falls to turn ON the P-channel MOS transistor Q6 and turn OFF the N-channel MOS transistor Q16. Therefore, the output voltage $V_{out}$ rapidly rises. On the other hand, when the input voltage $V_{in}$ falls, the voltage $V_d$ rises to turn ON the N-channel MOS transistor Q16 and turn OFF the P-channel MOS transistor Q6. Therefore, the output voltage $V_{out}$ rapidly falls.

Other examples of the voltage followers 2-1, 2-2, . . . , 2-383 and 2-384 are disclosed in JP-A-9-93055.

Even in FIG. 4, a high access mode state (BIC=high) is maintained for a predetermined time period immediately after the strobe signal STB is input, and thereafter, a low access mode state (BIC=low) is established, thus decreasing the power consumption. In this case, however, the bias changing signal BIC in synchronization with the strobe signal STB has to be input as an external signal to the bias circuit 5, which is a burden on the user. Additionally, when the number of data lines is increased, or when the resistance and capacity of the LCD panel fluctuates due to the manufacturing process thereof, the above-mentioned predetermined time period has to be adjusted by the user, which is another burden on the user.

Figure 6:
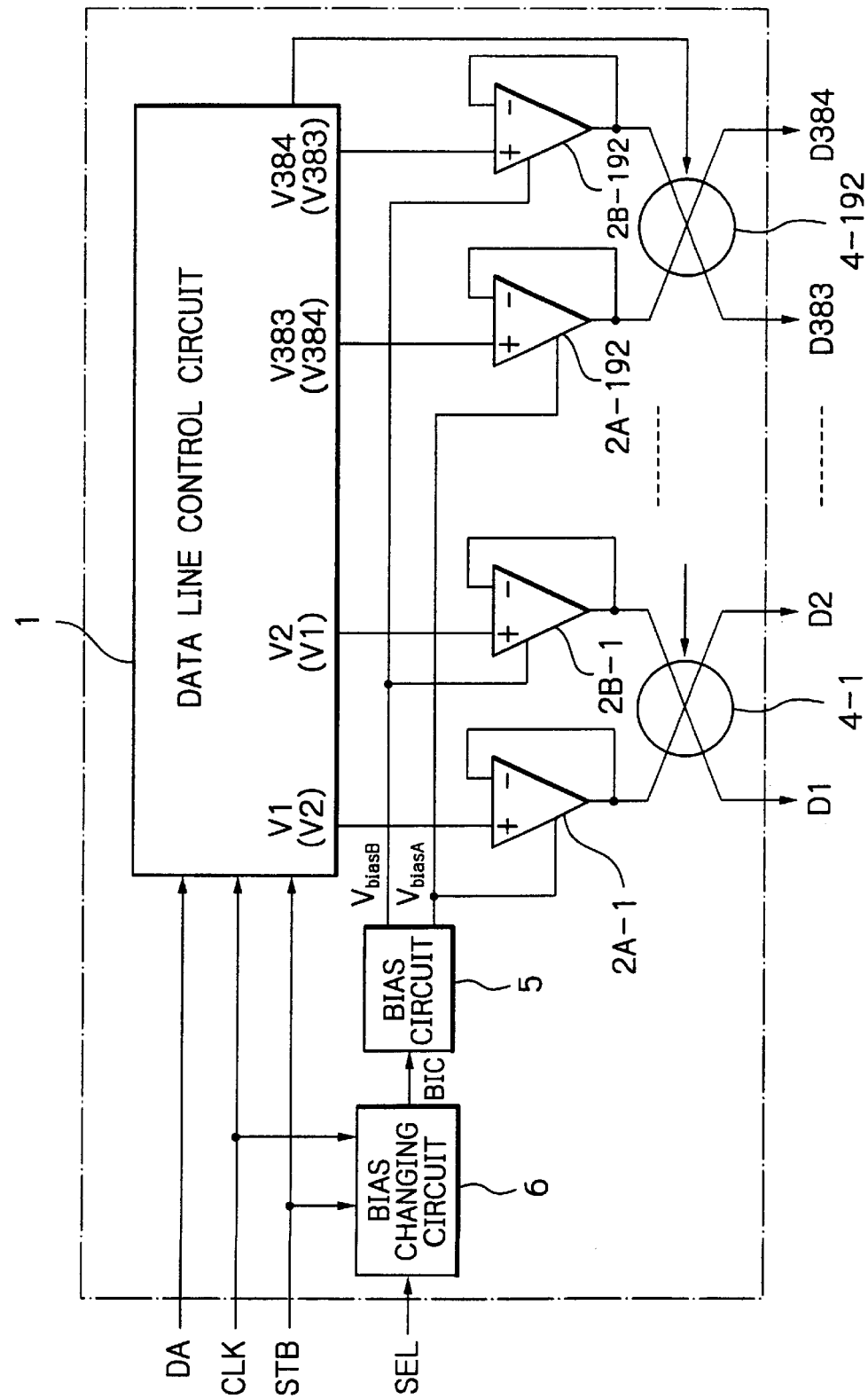
FIG. 6 is a circuit diagram illustrating a first embodiment of the data line driver of an LCD apparatus according to the present invention.

In FIG. 6, which illustrates a first embodiment of the data line driver of an LCD apparatus according to the present invention, a bias changing circuit 6 is added to the elements of FIG. 1. The bias changing circuit 6 receives the strobe signal STB and the clock signal CLK to generate the bias changing signal BIC. That is, the bias changing signal BIC is internally generated. Also, the bias changing circuit 6 receives a selection signal SEL to change the predetermined time period of a high access mode (high power consumption mode) in accordance with the number of data lines and/or the fluctuation of the resistance and capacitance of an LCD panel. Note that since the selection signal SEL is set to be low or high, the selection signal SEL can be easily set by the user.

Figure 7:
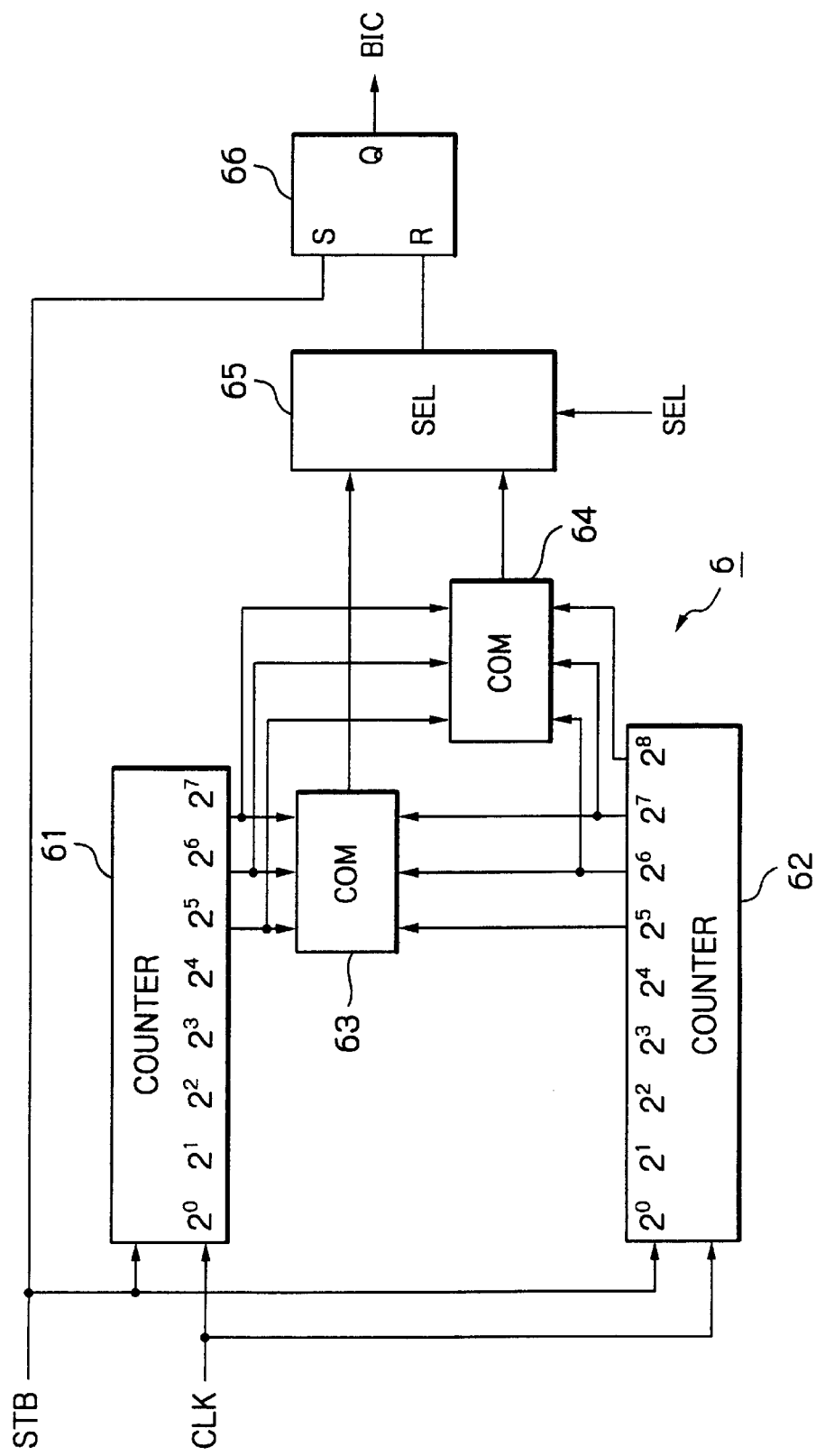
FIG. 7 is a block circuit diagram of the bias changing circuit of FIG. 6.

In FIG. 7, which is a detailed circuit diagram of the bias changing circuit 6 of FIG. 6, the bias changing circuit 6 is constructed by an 8-bit counter 61 for counting the pulses of the clock signal CLK, a 9-bit counter 62 for counting the pulses of the clock signal CLK, a comparator 63 for comparing the three most significant bits ($2^5, 2^6, 2^7$) of the output signal of the counter 62 except for the most significant bit ($2^8$) thereof with the three most significant bits ($2^5, 2^6, 2^7$) of the output signal of the counter 61, a comparator 64 for comparing the three most significant bits ($2^6, 2^7, 2^8$) of the output signal of the counter 62 with the three most significant bits ($2^5, 2^6, 2^7$) of the output signal of the counter 61, a selector 65 for selecting one of the comparators 63 and 64 in accordance with the selection signal SEL, and a flip-flop 66 which is set by a rising edge of the strobe signal STB and is reset by a rising edge of the output signal of the selector 65.

In more detail, the 8-bit counter 61 is reset and enabled by a rising edge of the strobe signal STB, and the operation of the 8-bit counter 61 is stopped by a falling edge of the strobe signal STB. Also, the 9-bit counter 62 is reset and enabled by a falling edge of the strobe signal STB.

Also, when the selection signal SEL is low, the selector 65 selects the comparator 63. On the other hand, when the selection signal SEL is high, the selector 65 selects the comparator 64. In both of the comparators 63 and 64, when the value of the predetermined three bits of the counter 62 exceeds that of the three most significant bits of the counter 61, the output signal rises.

Figures 8A, 8B:
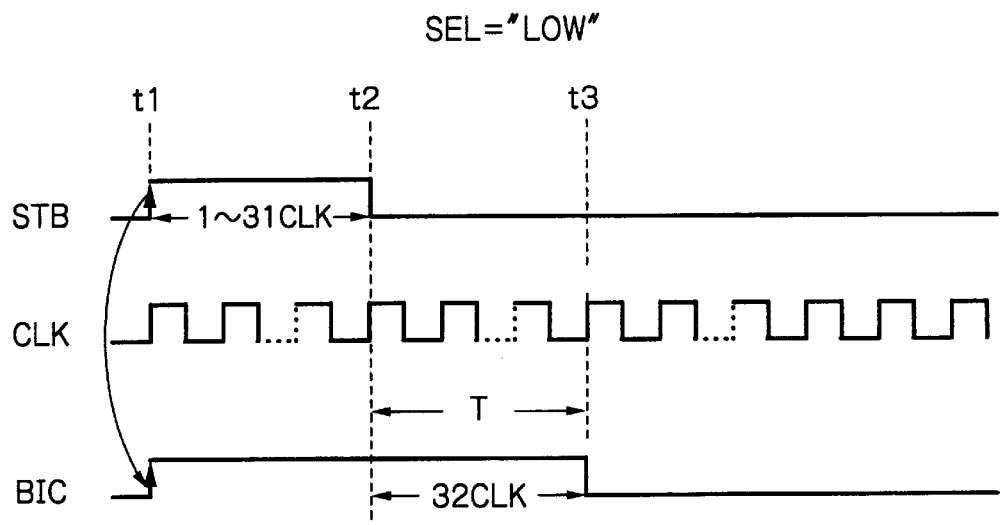
FIG. 8A is a timing diagram for explaining a first operation of the bias changing circuit of FIG. 7.
FIG. 8B is a table showing the first operation of FIG. 8A.

The operation of the bias changing circuit 6 of FIG. 7 is explained below,

First, assume that the selection signal SEL is low and the width of the strobe signal STB is 1 to 31 CLK where CLK designates one period of the clock signal CLK. In this case, the selector 65 selects the comparator 63, so that the 9-bit counter 62 substantially serves as an 8-bit counter whose three most significant bits are supplied to the comparator 63. As shown in FIG. 8A, at time t1, when the strobe signal STB rises, the flip-flop 66 is set so that the bias changing signal BIC rises. Next, at time t2, when the strobe signal STB falls, the three most significant bits ($2^5, 2^6, 2^7$) of the counter 61 are fixed at "000" as shown in FIG. 8B. Simultaneously, the counter 62 initiates to count the pulses of the clock signal CLK. Finally, at time t3, the most three significant bits ($2^5, 2^6, 2^7$) of the counter 62 reach "100" (=$2^5$=32), so that the output signal of the comparator 63 rises to reset the flip-flop 66. Thus, the bias changing signal BIC has a time period of the width of the strobe signal STB plus a time period T (=32CLK) depending on the width of the strobe signal STB.

Next, assume that the selection signal SEL is low and the width of the strobe signal STB is 32 to 63 CLK. Even in this case, the selector 65 selects the comparator 63, so that the 9-bit counter 62 substantially serves as an 8-bit counter whose three most significant bits are supplied to the comparator 63. As a result, when the strobe signal STB rises, the flip-flop 66 is set so that the bias changing signal BIC rises. Next, when the strobe signal STB falls, the three most significant bits ($2^5, 2^6, 2^7$) of the counter 61 are fixed at "100" as shown in FIG. 8B. Simultaneously, the counter 62 initiates to count the pulses of the clock signal CLK. Finally, the three most significant bits ($2^5, 2^6, 2^7$) of the counter 62 reach "010" (=$2^6$=64), so that the output signal of the comparator 63 rises to reset the flip-flop 66. Thus, the bias changing signal BIC has a time period of the width of the strobe signal STB plus a time period T (=64CLK) depending on the width of the strobe signal STB.

Next, assume that the selection signal SEL is low and the width of the strobe signal STB is 64 to 95 CLK. Even in this case, the selector 65 selects the comparator 63, so that the 9-bit counter 62 substantially serves as an 8-bit counter whose three most significant bits are supplied to the comparator 63. As a result, when the strobe signal STB rises, the flip-flop 66 is set so that the bias changing signal BIC rises. Next, when the strobe signal STB falls, the three most significant bits ($2^5, 2^6, 2^7$) of the counter 61 are fixed at "010" as shown in FIG. 8B. Simultaneously, the counter 62 initiates to count the pulses of the clock signal CLK. Finally, the three most significant bits ($2^5$, $2^6$, $2^7$) of the counter 62 reach "110" ($=2^5+2^6=96$), so that the output signal of the comparator 63 rises to reset the flip-flop 66. Thus, the bias changing signal BIC has a time period of the width of the strobe signal STB plus a time period T (=96CLK) depending on the width of the strobe signal STB.

Next, assume that the selection signal SEL is low and the width of the strobe signal STB is 96 to 127 CLK. Even in this case, the selector 65 selects the comparator 63, so that the 9-bit counter 62 substantially serves as an 8-bit counter whose three most significant bits are supplied to the comparator 63. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "110" as shown in FIG. 8B. Simultaneously, the counter 62 initiates to count the pulses of the clock signal CLK. Finally, the three most significant bits ($2^5$, $2^6$, $2^7$) of the counter 62 reach "001" ($=2^7=128$), so that the output signal of the comparator 63 rises to reset the flip-flop 66. Thus, the bias changing signal BIC has a time period of the width of the strobe signal STB plus a time period T (=128CLK) depending on the width of the strobe signal STB.

Next, assume that the selection signal SEL is low and the width of the strobe signal STB is 128 to 159 CLK. Even in this case, the selector 65 selects the comparator 63, so that the 9-bit counter 62 substantially serves as an 8-bit counter whose three most significant bits are supplied to the comparator 63. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "001" as shown in FIG. 8B. Simultaneously, the counter 62 initiates to count the pulses of the clock signal CLK. Finally, the three most significant bits ($2^5$, $2^6$, $2^7$) of the counter 62 reach "101" ($=2^5+2^7=160$), so that the output signal of the comparator 63 rises to reset the flip-flop 66. Thus, the bias changing signal BIC has a time period of the width of the strobe signal STB plus a time period T (=160CLK) depending on the width of the strobe signal STB.

Next, assume that the selection signal SEL is low and the width of the strobe signal STB is 160 to 191 CLK. Even in this case, the selector 65 selects the comparator 63, so that the 9-bit counter 62 substantially serves as an 8-bit counter whose three most significant bits are supplied to the comparator 63. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "101" as shown in FIG. 8B. Simultaneously, the counter 62 initiates to count the pulses of the clock signal CLK. Finally, the three most significant bits ($2^5$, $2^6$, $2^7$) of the counter 62 reach "011" ($=2^6+2^7=192$), so that the output signal of the comparator 63 rises to reset the flip-flop 66. Thus, the bias changing signal BIC has a time period of the width of the strobe signal STB plus a time period T (=192CLK) depending on the width of the strobe signal STB.

Next, assume that the selection signal SEL is low and the width of the strobe signal STB is 192 to 223 CLK. Even in this case, the selector 65 selects the comparator 63, so that the 9-bit counter 62 substantially serves as an 8-bit counter whose three most significant bits are supplied to the comparator 63. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "011" as shown in FIG. 8B. Simultaneously, the counter 62 initiates to count the pulses of the clock signal CLK. Finally, the three most significant bits ($2^5$, $2^6$, $2^7$) of the counter 62 reach "111" ($=2^5+2^6+2^7=224$), so that the output signal of the comparator 63 rises to reset the flip-flop 66. Thus, the bias changing signal BIC has a time period of the width of the strobe signal STB plus a time period T (=224CLK) depending on the width of the strobe signal STB.

Figures 9A, 9B:
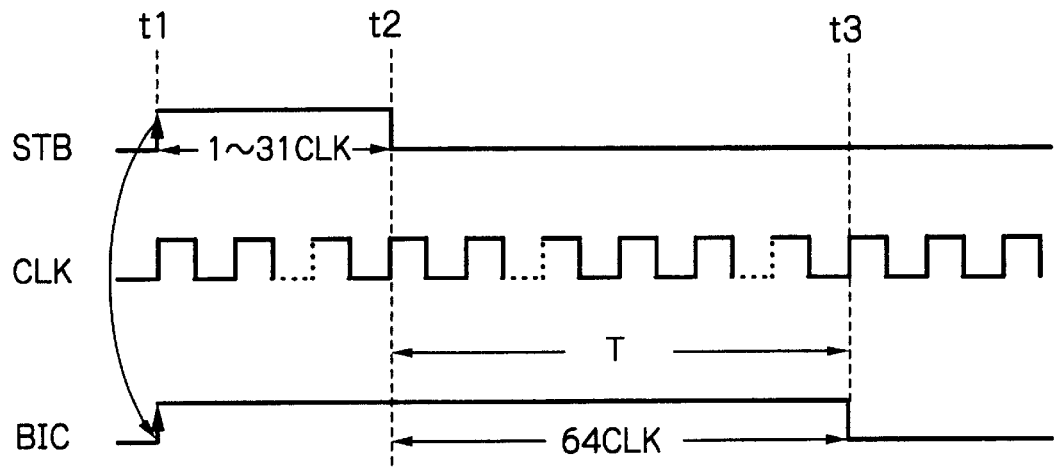
FIG. 9A is a timing diagram for explaining a second operation of the bias changing circuit of FIG. 7.
FIG. 9B is a table showing the second operation of FIG. 9A.

Next, assume that the selection signal SEL is high and the width of the strobe signal STB is 1 to 31 CLK. In this case, the selector 65 selects the comparator 64, so that the 9-bit counter 62 substantially serves as a 9-bit counter whose three most significant bits are supplied to the comparator 64. As shown in FIG. 9A, at time t1, when the strobe signal STB rises, the flip-flop 66 is set so that the bias changing signal BIC rises. Next, at time t2, when the strobe signal STB falls, the three most significant bits ($2^5$, $2^6$, $2^7$) of the counter 61 are fixed at "000" as shown in FIG. 9B. Simultaneously, the counter 62 initiates to count the pulses of the clock signal CLK. Finally, at time t3, the three most significant bits ($2^6$, $2^7$, $2^8$) of the counter 62 reach "100" ($=2^6=64$), so that the output signal of the comparator 64 rises to reset the flip-flop 66. Thus, the bias changing signal BIC has a time period of the width of the strobe signal STB plus a time period T (=64CLK) depending on the width of the strobe signal STB.

Next, assume that the selection signal SEL is high and the width of the strobe signal STB is 32 to 63 CLK. Even in this case, the selector 65 selects the comparator 64, so that the 9-bit counter 62 substantially serves as a 9-bit counter whose three most significant bits are supplied to the comparator 64. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "100" as shown in FIG. 9B. Simultaneously, the counter 62 initiates to count the pulses of the clock signal CLK. Finally, the three most significant bits ($2^6$, $2^7$, $2^8$) of the counter 62 reach "010" ($=2^7=128$), so that the output signal of the comparator 64 rises to reset the flip-flop 66. Thus, the bias changing signal BIC has a time period of the width of the strobe signal STB plus a time period T (=128CLK) depending on the width of the strobe signal STB.

Next, assume that the selection signal SEL is high and the width of the strobe signal STB is 64 to 95 CLK. Even in this case, the selector 65 selects the comparator 64, so that the 9-bit counter 62 substantially serves as a 9-bit counter whose three most significant bits are supplied to the comparator 63. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "010" as shown in FIG. 9B. Simultaneously, the counter 62 initiates to count the pulses of the clock signal CLK. Finally, the three most significant bits ($2^6$, $2^7$, $2^8$) of the counter 62 reach "110" ($=2^6+2^7=192$), so that the output signal of the comparator 64 rises to reset the flip-flop 66. Thus, the bias changing signal BIC has a time period of the width of the strobe signal STB plus a time period T (=192CLK) depending on the width of the strobe signal STB.

Next, assume that the selection signal SEL is high and the width of the strobe signal STB is 96 to 127 CLK. Even in this case, the selector 65 selects the comparator 64, so that the 9-bit counter 62 substantially serves as a 9-bit counter whose three most significant bits are supplied to the comparator 64. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "110" as shown in FIG. 9B. Simultaneously, the counter 62 initiates to count the pulses of the clock signal CLK. Finally, the three most significant bits ($2^6$, $2^7$, $2^8$) of the counter 62 reach "001" (=$2^8$=256), so that the output signal of the comparator 64 rises to reset the flip-flop 66. Thus, the bias changing signal BIC has a time period of the width of the strobe signal STB plus a time period T (=256CLK) depending on the width of the strobe signal STB.

Next, assume that the selection signal SEL is high and the width of the strobe signal STB is 128 to 159 CLK. Even in this case, the selector 65 selects the comparator 64, so that the 9-bit counter 62 substantially serves as a 9-bit counter whose three most significant bits are supplied to the comparator 64. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "001" as shown in FIG. 9B. Simultaneously, the counter 62 initiates to count the pulses of the clock signal CLK. Finally, the three most significant bits ($2^6$, $2^7$, $2^8$) of the counter 62 reach "101" (=$2^6$+$2^8$=320), so that the output signal of the comparator 64 rises to reset the flip-flop 66. Thus, the bias changing signal BIC has a time period of the width of the strobe signal STB plus a time period T (=320CLK) depending on the width of the strobe signal STB.

Next, assume that the selection signal SEL is high and the width of the strobe signal STB is 160 to 191 CLK. Even in this case, the selector 65 selects the comparator 64, so that the 9-bit counter 62 substantially serves as a 9-bit counter whose three most significant bits are supplied to the comparator 64. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "101" as shown in FIG. 9B. Simultaneously, the counter 62 initiates to count the pulses of the clock signal CLK. Finally, the three most significant bits ($2^6$, $2^7$, $2^8$) of the counter 62 reach "011" (=$2^7$+$2^8$=384), so that the output signal of the comparator 64 rises to reset the flip-flop 66. Thus, the bias changing signal BIC has a time period of the width of the strobe signal STB plus a time period T (=384CLK) depending on the width of the strobe signal STB.

Next, assume that the selection signal SEL is high and the width of the strobe signal STB is 192 to 223 CLK. Even in this case, the selector 65 selects the comparator 64, so that the 9-bit counter 62 substantially serves as a 9-bit counter whose three most significant bits are supplied to the comparator 64. As a result, when the strobe signal STB rises, the flip-flop 66 is set so that the bias changing signal BIC rises. Next, when the strobe signal STB falls, the three most significant bits ($2^5$, $2^6$, $2^7$) of the counter 61 are fixed at "011" as shown in FIG. 8B. Simultaneously, the counter 62 initiates to count the pulses of the clock signal CLK. Finally, the three most significant bits ($2^6$, $2^7$, $2^8$) of the counter 62 reach "111" (=$2^6$+$2^7$+$2^8$=448), so that the output signal of the comparator 64 rises to reset the flip-flop 66. Thus, the bias changing signal BIC has a time period of the width of the strobe signal STB plus a time period T (=448CLK) depending on the width of the strobe signal STB.

In FIG. 7, the larger the width of the strobe signal STB, the longer the predetermined time period of the bias changing signal BIC. Also, the predetermined time period of the bias changing signal BIC is changed in accordance with the selection signal SEL.

Figure 10:
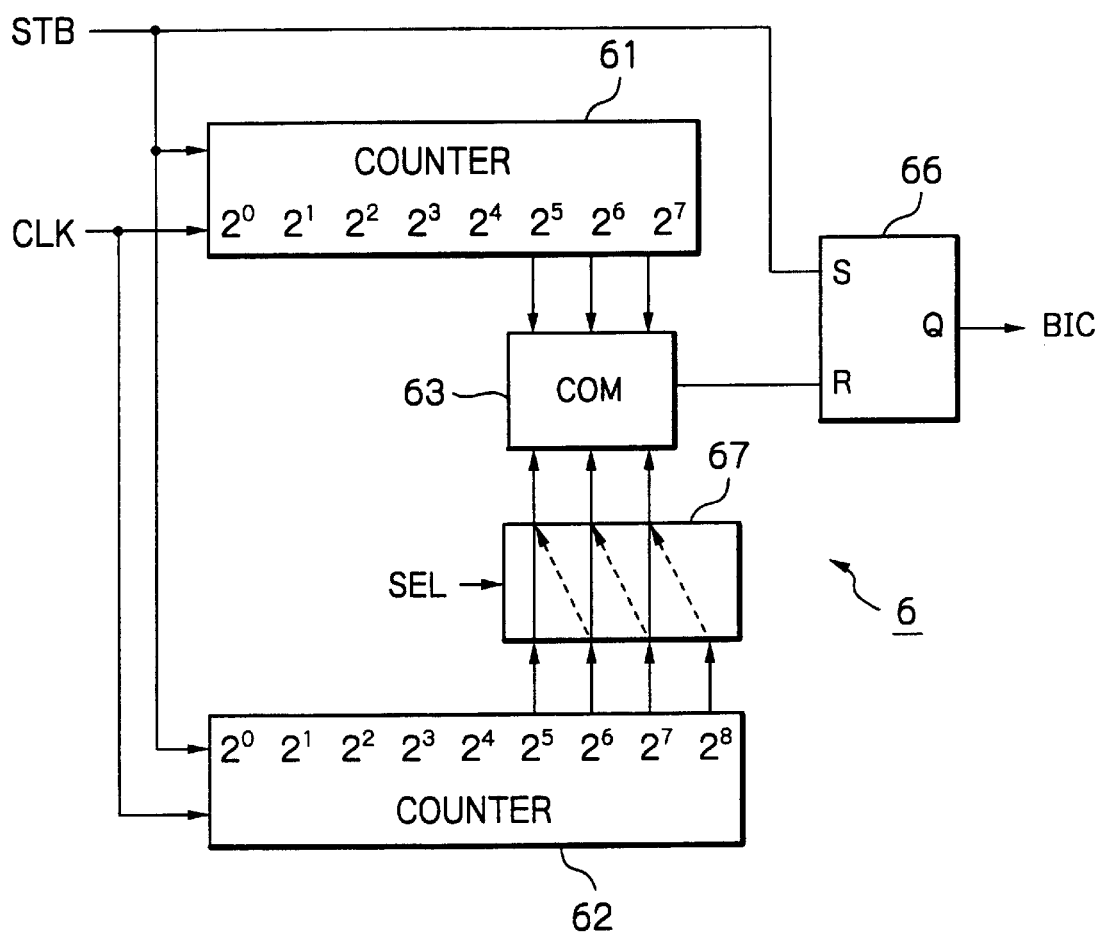
FIG. 10 is a circuit diagram illustrating a modification of the bias changing circuit of FIG. 7.

In FIG. 10, which illustrates a modification of the bias changing circuit 6 of FIG. 7, a selector 67 is provided instead of the comparator 64 and the selector 65 of FIG. 7. That is, when the selection signal SEL is low, the selector 67 select the most significant bits ($2^5$, $2^6$, $2^7$) of the counter 62, so that the most significant bits ($2^5$, $2^6$, $2^7$) are supplied to the comparator 63. Thus, the comparator 63 serves as the comparator 63 of FIG. 7 and the counter 62 serves as an 8-bit counter. On the other hand, when the selection signal SEL is high, the selector 67 select the most significant bits ($2^6$, $2^7$, $2^8$) of the counter 62, so that the most significant bits ($2^6$, $2^7$, $2^8$) are supplied to the comparator 63. Thus, the comparator 63 serves as the comparator 64 of FIG. 7 and the counter 62 serves as a 9-bit counter.

Figure 11:
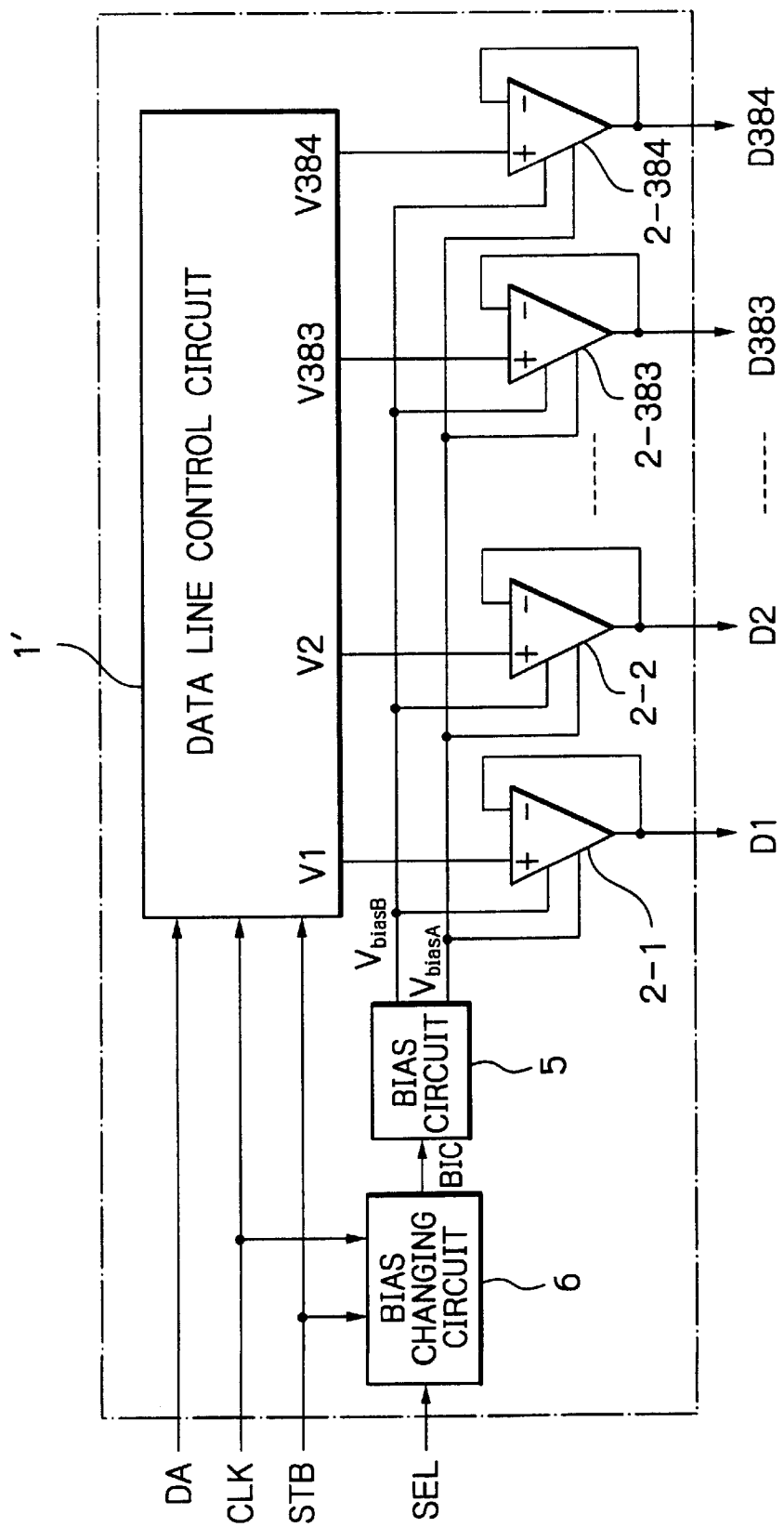
FIG. 11 is a circuit diagram illustrating a second embodiment of the data line driver of an LCD apparatus according to the present invention.

In FIG. 11, which illustrates a second embodiment of the data line driver of an LCD apparatus according to the present invention, a bias changing circuit 6 of FIG. 6 is added to the elements of FIG. 4. Even in FIG. 11, the bias changing circuit 6 receives the strobe signal STB and the clock signal CLK to generate the bias changing signal BIC. That is, the bias changing signal BIC is internally generated. Also, the bias changing circuit 6 receives a selection signal SEL to change the predetermined time period of a high access mode (high power consumption mode) in accordance with the number of data lines and/or the fluctuation of the resistance and capacitance of an LCD panel. Note that since the selection signal SEL is set to be low or high, the selection signal SEL can be easily set by the user.

Figure 12:
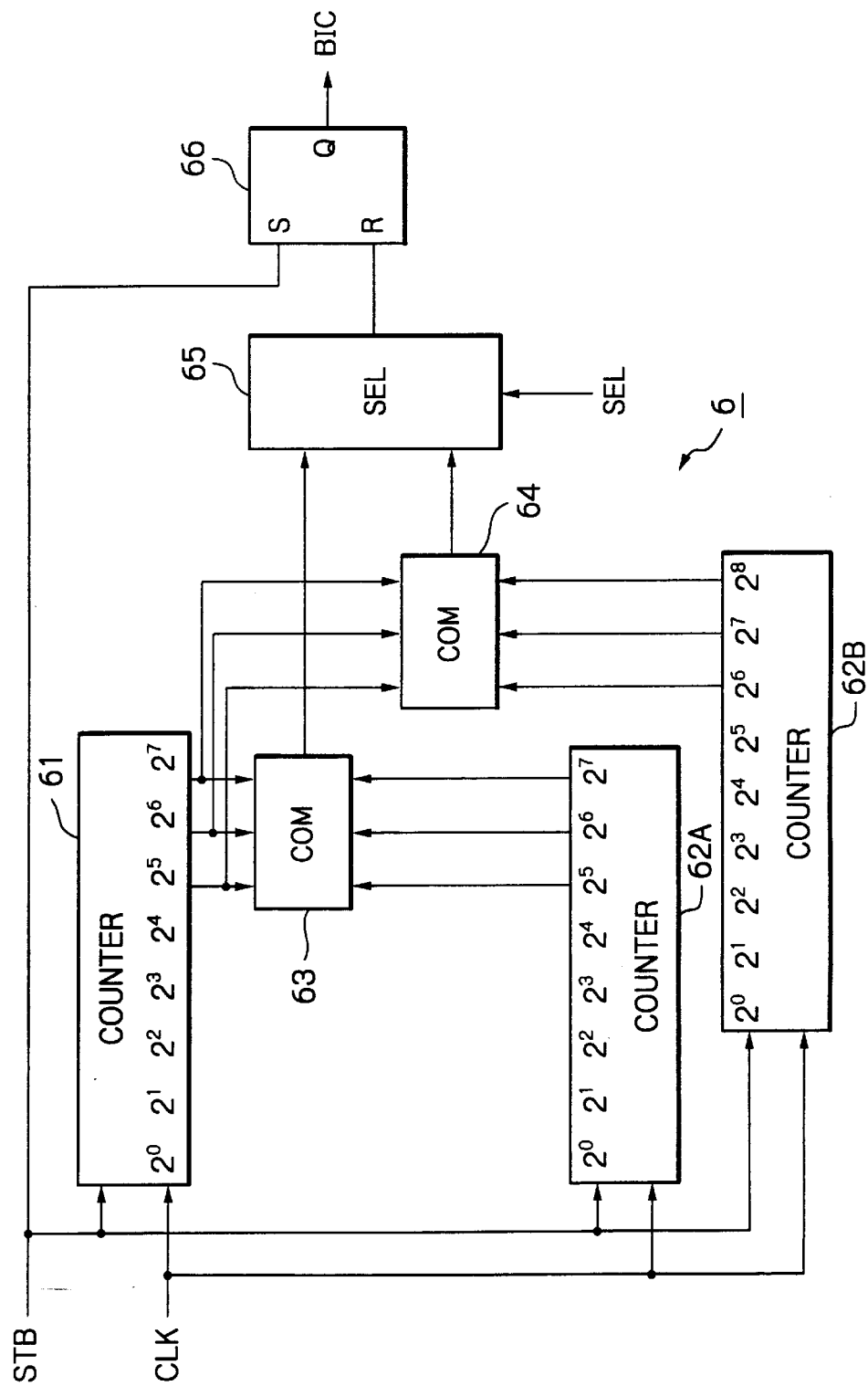
FIGS. 12 and 13 are block circuit diagrams illustrating modifications of the bias changing circuits of FIGS. 7 and 10, respectively.
Figure 13:
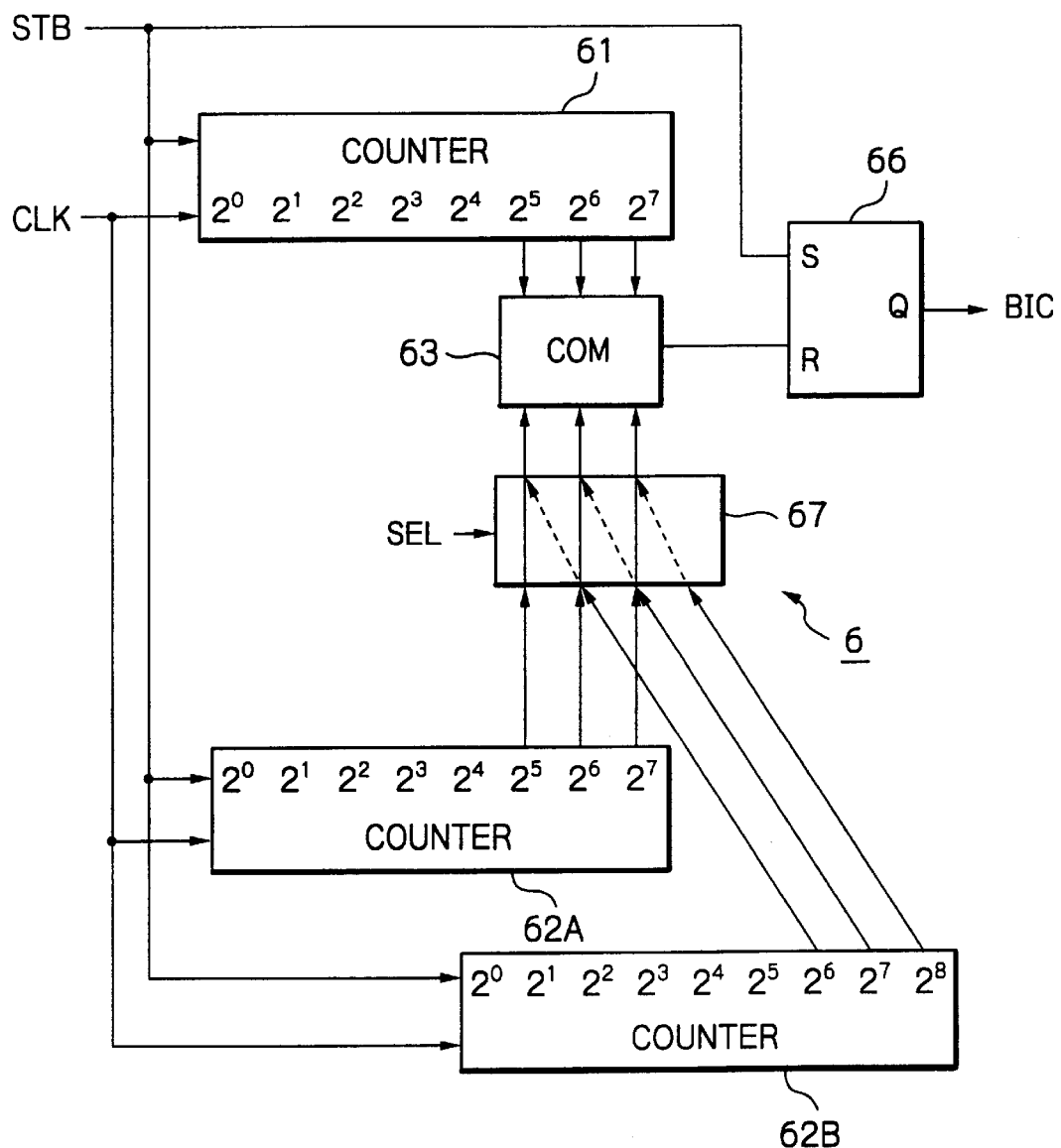

In the above-described embodiments, the counter 61 is an 8-bit counter and the counter 62 is a 9-bit counter, however, the counter 61 can be an m-bit (m=2, 3, . . . ) counter and the counter 62 can be an (m+1) or more—bit counter. In this case, the comparator 63 (64) compares the n(n<m) bits of the counter 62 with the n most significant bits of the counter 62. Also, the counter 62 can be actually constructed by an 8-bit counter 62A and a 9-bit counter 62B as illustrated in FIGS. 12 and 13.

Figure 15:
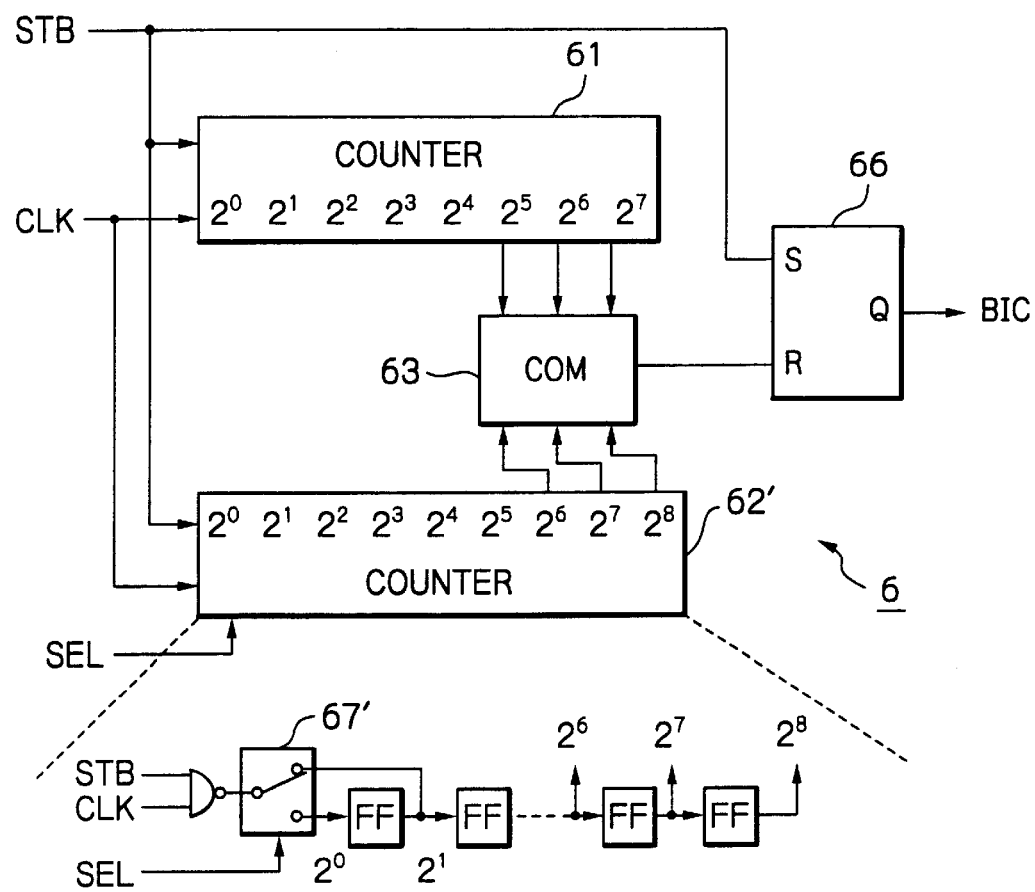
FIG. 15 is a block circuit diagram illustrating a modification of the bias changing circuit of FIG. 10.

Further, in FIG. 10, the selector 67 can be introduced into the counter 62. That is, as illustrated in FIG. 15, a 9-bit counter 62' includes a selector 67' corresponding to the selector 67 of FIG. 10 connected to a 9-bit counter portion formed by nine flip-flops. In this case, when the selection signal SEL is low, the counter 62' substantially serves as an 8-bit counter, while, when the selection signal SEL is high, the counter 62' substantially serves as a 9-bit counter. Also, in FIG. 15, the selector 67' can bypass an intermediate one of the flip-flops.

Further, in FIG. 15, note that the counter 62' can be a 10 or more-bit counter. In this case, when the selection signal SEL is low, the counter 62' substantially serves as an 8-bit counter, while, when the selection signal SEL is high, the counter 62' substantially serves as a 10 or more-bit counter.

Further, the present invention can be applied to a driver for driving a capacitive load other than a data line driver for an LCD apparatus.

Figure 14A:
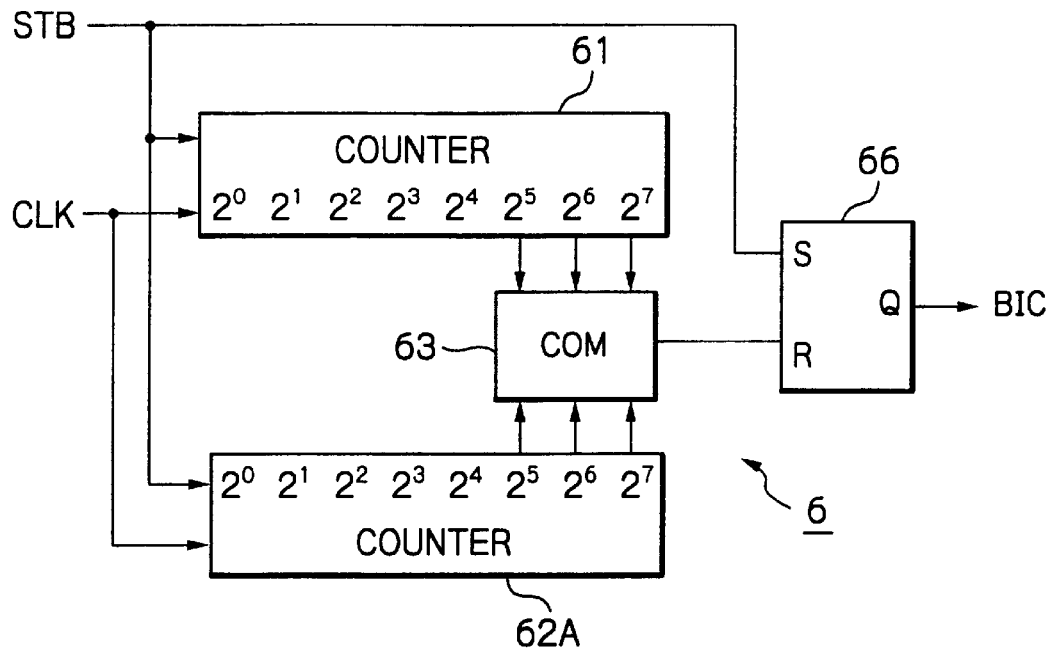
FIGS. 14A and 14B are block circuit diagrams illustrating further modifications of the bias changing circuits of FIGS. 12 and 13.
Figure 14B:
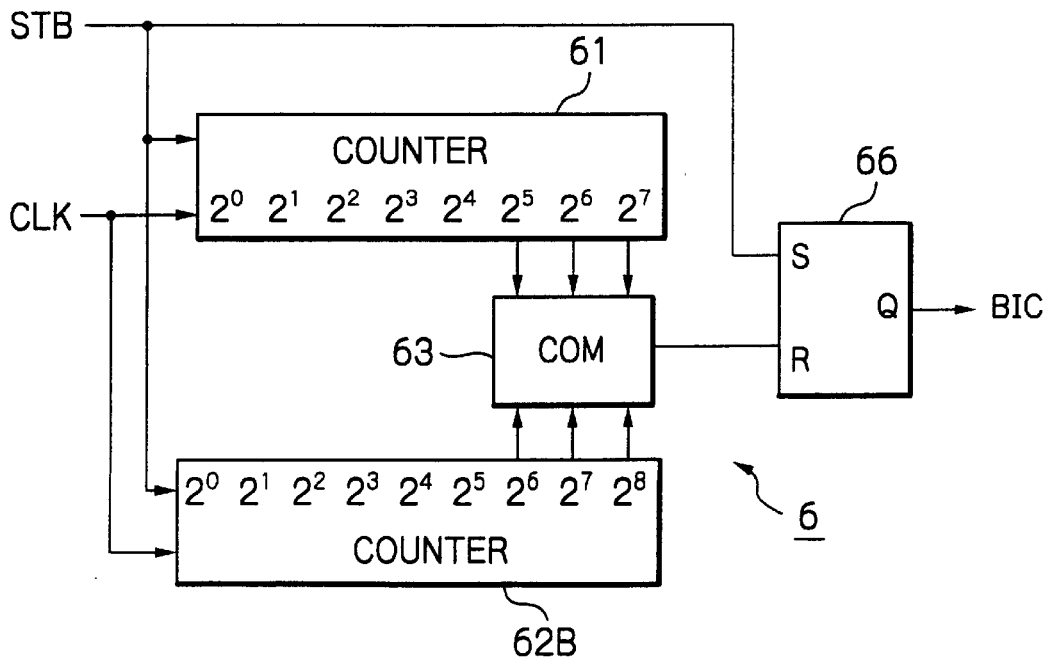

Further, the present invention can be applied to a semiconductor device having a bias changing circuit 6 which does not receive the selection signal SEL. In this case, as illustrated in FIGS. 14A and 14B, the bias changing circuit 6 is constructed by the counter 61, the counter 62A or 62B, the comparator 63 and the flip-flop 66. Note that the counter 62B can be a 10-bit or more-bit counter.

As explained hereinabove, according to the present invention, since a bias changing signal is internally generated by a control signal, the burden of users can be decreased.

What is claimed is:

1. A semiconductor device comprising:
   at least one operational amplifier for driving a capacitive load in accordance with a control signal;
   a bias changing circuit for receiving said control signal to generate a bias changing signal in synchronization with said control signal dependent upon a width of said control signal; and
   a bias circuit, connected between said bias changing circuit and said operational amplifier, for controlling a bias current flowing through said operational amplifier in accordance with said bias changing signal.

2. The device as set forth in claim 1, wherein said bias circuit causes said bias current to be in a high bias mode when said bias changing signal is in a first state and causes said bias current to be in a low bias mode when said bias changing signal is in a second state,
   said bias changing circuit changing a time period of said first state of said bias changing signal in accordance with the width of said control signal.

3. The device as set forth in claim 2, wherein the larger the width of said control signal, the longer the time period of said first state.

4. The device as set forth in claim 1, being a data line driver of a liquid crystal display apparatus,
   said control signal being a strobe signal,
   said capacitive load being a data line.

5. The device as set forth in claim 1, wherein said bias changing circuit comprises:
   a first counter circuit for measuring the width of said control signal;
   a second counter circuit for measuring a time period after said control signal is ended;
   a comparator circuit, connected to said first and second counter circuits, for comparing the time period of said second counter circuit with the width of said control signal to generate an output signal when the time period of said second counter circuit exceeds the width of said control signal; and
   a bias changing signal generating circuit, connected to said comparator circuit, for receiving said control signal to generate said bias changing signal which is started by a start timing of said control signal and is ended by the output signal of said compartor circuit.

6. The device as set forth in claim 5, wherein said first counter circuit comprises a first m(m=2, 3,)-bit counter,
   said second counter circuit comprising a second m-bit counter,
   said compartor circuit comparing n(n<m) most significant bits of said second m-bit counter with n most significant bits of said first m-bit counter.

7. The device as set forth in claim 1, wherein said bias changing circuit further receives a selection signal to change said bias changing signal in accordance with said selection signal.

8. The device as set forth in claim 7, wherein said bias changing circuit comprises:
   an m (m=2, 3,)-bit counter circuit for measuring the width of said control signal;
   a counter circuit for measuring a time period after said control signal is ended, said counter circuit serving as an m-bit counter when receiving a first state of said selection signal and serving as an (m+1) or more bit counter when receiving a second state of said selection signal;
   a comparator, connected to said m-bit counter and said counter circuit, for comparing n (n<m) most significant bits of said m-bit counter with n most significant bits of said counter circuit; and
   a bias changing signal generating circuit, connected to said comparator, for receiving said control signal to generate said bias changing signal which is started by a start timing of said control signal and is ended by the output signal of said comparator.

9. The device as set forth in claim 7, wherein said bias changing circuit comprises:
   a first counter circuit for measuring the width of said control signal;
   a second counter circuit for measuring a time period after said control signal is ended;
   a comparator circuit, connected to said first and second counter circuits, for comparing the time period of said second counter circuit with the width of said control signal to generate an output signal when the time period of said second counter circuit exceeds the width of said control signal; and
   a bias changing signal generating circuit, connected to said comparator circuit, for receiving said control signal to generate said bias changing signal which is started by a start timing of said control signal and is ended by the output signal of said compartor circuit.

10. The device as set forth in claim 9, wherein said first counter circuit comprises an m(m=2, 3,)-bit counter,
    said second counter circuit comprising an(m+1)-bit counter,
    said compartor circuit comprising:
    a first comparator for comparing n(n<m)-bit more significant bits of said (m+1)-bit counter except for the most significant bit thereof with n-bit most significant bits of said m-bit counter;
    a second comparator for comparing n most significant bits of said (m+1)-bit counter with the n most significant bits of said m-bit counter; and
    a selector, connected between said first and second comparators and said bias changing signal generating circuit, for selecting one of said first and second comparators in accordance with said selection signal.

11. The device as set forth in claim 9, wherein said first counter circuit comprises a first m(m=2, 3,)-bit counter,
    said second counter circuit comprising a second m-bit counter and an(m+1)-bit counter,
    said compartor circuit comprising:
    a first comparator for comparing n(n<m) most significant bits of said second m-bit counter with n most significant bits of said first m-bit counter;
    a second comparator for comparing n most significant bits of said (m+1)-bit counter with the n most significant bits of said first m-bit counter; and
    a selector, connected between said first and second comparators and said bias changing signal generating circuit, for selecting one of said first and second comparators in accordance with said selection signal.

12. The device as set forth in claim 9, wherein said first counter circuit comprises an m(m=2, 3,)-bit counter,
    said second counter circuit comprising:
    an(m+1)-bit counter; and
    a selector, connected to said (m+1)-bit counter, for selecting n(n<m)-bit more significant bits of said (m+1)-bit counter except for the most significant bit thereof or n most significant bits of said (m+1)-bit counter in accordance with said selection signal, said compartor circuit comprising a comparator for comparing the output bits of said selector with n most significant bits of said m-bit counter.

13. The device as set forth in claim 9, wherein said first counter circuit comprises a first m(m=2, 3,)-bit counter, said second counter circuit comprising:

a second m-bit counter;

an(m+1)-bit counter, a selector, connected to said second m-bit counter and said (m+1)-bit counter, for selecting n(n<m) most significant bits of said second m-bit counter or n most significant bits of said (m+1)-bit counter in accordance with said selection signal, said comparator circuit comprising a comparator for comparing the output bits of said selector with n most significant bits of said m-bit counter.

14. A semiconductor device comprising:

at least one operational amplifier for driving a capacitive load in accordance with a control signal and a clock signal;

a bias changing circuit for receiving said control signal and said clock signal to generate a bias changing signal; and a bias circuit, connected between said bias changing circuit and said operational amplifier, for controlling a bias current flowing through said operational amplifier in accordance with said bias changing signal, said bias changing circuit comprising:

an m-bit counter for counting pulses of said clock signal when said control signal is being received;

an m'-bit (m'≧m) counter for counting pulses of said clock signal when said control signal is ended;

an n-bit (n<m) comparator, connected to said m-bit counter and said m'-bit counter, comparing n most significant bits of an output signal of said m'-bit counter with n most significant bits of an output signal of said m-bit counter, to generate an output signal when the n most significant bits of the output signal of said m'-bit counter exceeds the n most significant bits of the output signal of said m-bit counter;

a flip-flop, connected to said n-bit comparator, for receiving said control signal to generate said bias changing signal which is started by a start timing of said control signal and ended by the output signal of said comparator.

15. A data driver for a liquid crystal display apparatus comprising:

at least one operational amplifier for driving a data line in accordance with a strobe signal;

a bias changing circuit for receiving said strobe signal to generate a bias changing signal in synchronization with said strobe signal dependent upon a width of said strobe signal; and a bias circuit, connected between said bias changing circuit and said operational amplifier, for controlling a bias current flowing through said operational amplifier in accordance with said bias changing signal.

16. A data driver for a liquid crystal display apparatus comprising:

at least one operational amplifier for driving a data line in accordance with a strobe signal;

a bias changing circuit for receiving said strobe signal and a selection signal to generate a bias changing signal in synchronization with said strobe signal dependent upon a width of said strobe signal and said selection signal; and a bias circuit, connected between said bias changing circuit and said operational amplifier, for controlling a bias current flowing through said operational amplifier in accordance with said bias changing signal.

* * * * *